United States Patent
Yamada et al.

(10) Patent No.: US 8,557,404 B2
(45) Date of Patent: Oct. 15, 2013

(54) TRANSPARENT CONDUCTIVE FILM HAVING FTO/ITO LAMINATE

(75) Inventors: Shigeo Yamada, Sodegaura (JP); Tatsuya Ooashi, Toride (JP)

(73) Assignee: Nippon Soda Co., Ltd., Tokyo (JP)

( * ) Notice: Subject to any disclaimer, the term of this patent is extended or adjusted under 35 U.S.C. 154(b) by 420 days.

(21) Appl. No.: 13/000,206

(22) PCT Filed: Jun. 22, 2009

(86) PCT No.: PCT/JP2009/002844
§ 371 (c)(1),
(2), (4) Date: Dec. 20, 2010

(87) PCT Pub. No.: WO2009/157177
PCT Pub. Date: Dec. 30, 2009

(65) Prior Publication Data
US 2011/0111215 A1     May 12, 2011

(30) Foreign Application Priority Data

Jun. 24, 2008    (JP) ................................. 2008-164417

(51) Int. Cl.
C03C 17/23     (2006.01)
C03C 17/245     (2006.01)
C03C 17/34     (2006.01)
H01L 21/283     (2006.01)

(52) U.S. Cl.
USPC ........... 428/696; 428/428; 428/432; 428/697; 428/701; 438/609

(58) Field of Classification Search
None
See application file for complete search history.

(56) References Cited

U.S. PATENT DOCUMENTS

| | | | | |
|---|---|---|---|---|
| 6,586,101 B2 * | 7/2003 | Chu | | 428/432 |
| 7,683,379 B2 * | 3/2010 | Goto et al. | | 257/79 |
| 7,718,091 B2 * | 5/2010 | Zijp et al. | | 252/500 |
| 7,820,295 B2 * | 10/2010 | Kim et al. | | 428/432 |
| 2003/0170437 A1 * | 9/2003 | Kawashima et al. | | 428/212 |
| 2009/0025791 A1 * | 1/2009 | Matsui | | 136/261 |
| 2009/0053511 A1 * | 2/2009 | Kim et al. | | 428/332 |
| 2012/0090678 A1 * | 4/2012 | Sekiguchi et al. | | 136/256 |

FOREIGN PATENT DOCUMENTS

| | | |
|---|---|---|
| EP | 1 628 310 | 2/2006 |
| JP | 07-198648 | 8/1995 |
| JP | 2005-302695 | 10/2005 |
| JP | A-2006-066892 | 3/2006 |

OTHER PUBLICATIONS

Translation of JP 2005-302695, Fukano Tatsuo et al. Oct. 2005.*

(Continued)

*Primary Examiner* — David Sample
(74) *Attorney, Agent, or Firm* — Kenyon & Kenyon LLP

(57) ABSTRACT

A transparent conductive film for lamination on a substrate and comprising an ITO film and an FTO film, wherein a part or all of the crystal structure of a surface of the FTO film is orthorhombic, and a transparent conductive film for lamination on a substrate and comprising an ITO film and an FTO film, wherein the thickness of the FTO film is within a range from 5 nm to 20 nm and the FTO film is a continuous film. A method of producing the transparent conductive films includes depositing the ITO film on a substrate using a pyrosol process, and subsequently depositing the FTO film continuously on top of the ITO film.

4 Claims, 3 Drawing Sheets

(56) References Cited

OTHER PUBLICATIONS

K. Subba Ramaiah et al., "Structural and Electrical Properties of Fluorine Doped Tin Oxide Films Prepared by Spray-Pyrolysis Technique", Applied Surface Science, 253, 2006, pp. 1451-1458.

Office Action issued in TW Application No. 098120798, mailed on Sep. 13, 2012, with enclosed search report, 11 pages total (English translation included).

Office Action issued in JP Application No. 2010-517752, mailed on Oct. 9, 2012, 6 pages (English translation included).

Sangaletti, L., et al., "Microstructure and morphology of tin dioxide multilayer thin film gas sensors", Sensors and Actuators B, 1997, vol. 44, pp. 268-274.

Chen, Zhiwen, et al., "Facile strategy and mechanism for orthorhombic $SnO_2$ thin films", Applied Physics Letters, 2006, vol. 89, pp. 231902-1-231902-3.

Fukano, Tatsuo, et al., "Ionization potentials of transparent conductive indium tin oxide films covered with a single layer of fluorine-doped tin oxide nanoparticles grown by spray pyrolysis deposition", Journal of Applied Physics, 2005, vol. 97, pp. 084314-1-084314-6.

EP Search Report issued for 09769887.2, mailed on Jun. 22, 2011, 10 pages.

Chinese Office Action for 200980123521.3 dated Oct. 27, 2011, 3 pages.

Hu, Zhi-qiang, et al., "Study on FTO/ITO Composite Conducting Films", 2005, pp. 1886-1888 (English translation included).

Office Action issued in EP Application No. 09769887.2, mailed on Mar. 12, 2013, 7 pages total.

* cited by examiner

THIN FILM X-RAY DIFFRACTION   2θχ (deg)

TRANSPARENT CONDUCTIVE FILM HAVING FTO/ITO LAMINATE

This application is a national phase application of PCT/JP2009/002844 filed Jun. 22, 2009 which claims priority under 35 U.S.C. 119 to Japanese Patent Application No. 2008-164417 filed Jun. 24, 2008.

TECHNICAL FIELD

The present invention relates to a transparent conductive film used for a transparent electrode plate or the like, and relates particularly to an FTO/ITO laminated film that is ideal as a transparent electrode for a dye-sensitized solar cell or the like.

Priority is claimed on Japanese Patent Application No. 2008-164417, filed Jun. 24, 2008, the content of which is incorporated herein by reference.

BACKGROUND ART

Dye-sensitized solar cells are solar cells in which a dye that absorbs sunlight releases electrons upon absorbing light, thereby generating electricity. An article published in 1991 by Michael Gratzel of the Ecole Polytechnique Federale de Lausanne (EPFL) in Switzerland initiated the research into these solar cells. In terms of the cell mechanism, when light enters the cell, the dye inside the cell enters an excited state, thereby releasing electrons. These electrons are transported through titanium oxide ($TiO_2$) to a transparent electrode, and then flow out of the cell. Meanwhile, the dye that has been converted to cations as a result of the electron release receives electrons that have been supplied from the other electrode via iodine (I) within the electrolyte, and is thereby returned to its original state.

Examples of the types of properties required for the transparent electrode used in these types of solar cells include low resistance, thermal stability and chemical stability, high light transmittance, moisture resistance, and low cost. As the transparent conductive film of an electrode that satisfies these properties, a fluorine-doped tin oxide film (FTO film) is preferred to the more typical tin-doped indium oxide film (ITO film), as it exhibits superior stability under thermal and chemical conditions.

However, because ITO films exhibit excellent transparency and conductivity, they are widely used in liquid crystal display elements and solar cells, and therefore films in which an FTO film is laminated on top of an ITO film have also been developed. One example is reported in Patent Document 1.

Patent Document 1 discloses that an ITO film thickness of 100 nm to 1,000 nm and an FTO film thickness of at least 30 nm to 350 nm are ideal, and also discloses that provided the FTO film is of this thickness, the laminated film exhibits no reduction in conductivity even when heated at a temperature of 250 to 700° C. for one hour. Further, the document also discloses that deposition of the FTO film must be performed continuously following deposition of the ITO film. Hence, it is disclosed that the raw material compound solution that generates the FTO film must be sprayed immediately following formation of the ITO film, while the vitreous film is still at a temperature of approximately 400 to 500° C., so that the FTO film is formed by a spray pyrolysis deposition method (SPD method) before the ITO film begins to deteriorate.

However, this method is not entirely satisfactory, because the overall film is quite thick, meaning problems of cost tend to arise, and the thickness of the FTO film is also quite large, meaning the advantages of the ITO film do not manifest adequately.

PRIOR ART DOCUMENTS

Patent Documents

[Patent Document 1]
Japanese Unexamined Patent Application, First Publication No. 2003-323818

DISCLOSURE OF INVENTION

Problems to be Solved by the Invention

Accordingly, an object of the present invention was to produce a transparent conductive film having an FTO/ITO laminated film that can be used for the transparent electrode plate of solar cells, and particularly the transparent electrode of dye-sensitized solar cells and the like, exhibits the advantages of both FTO and ITO, and is of reasonable cost.

Means to Solve the Problems

As a result of intensive investigation, the inventors of the present invention discovered that when preparing an FTO/ITO laminated film on a glass substrate using a pyrosol process, by laminating the ITO film and the FTO film in a continuous manner while the glass sheet was moved through the deposition furnace on a conveyor, the surface of the FTO film was formed as a film having orthorhombic crystals, meaning that even if the thickness of the FTO film was 20 nm or less, a laminated film with excellent heat resistance was able to be obtained, and they were therefore able to complete the present invention.

In other words, the present invention relates to:
(1) a transparent conductive film for lamination on a substrate and comprising an ITO film and an FTO film, wherein a part or all of a crystal structure of a surface of the FTO film is orthorhombic,
(2) the transparent conductive film according to (1), wherein a degree of change in sheet resistance following heating at 350° C. for one hour is not more than 1.5-fold, and
(3) the transparent conductive film according to (1) or (2), wherein a sheet resistance is not more than 300 Ω/sq.

The present invention also relates to:
(4) a method of producing the transparent conductive film according to any one of (1) to (3), the method comprising depositing the ITO film on a substrate using a pyrosol process, and subsequently depositing the FTO film continuously on top of the ITO film.

The present invention also relates to:
(5) a transparent conductive film for lamination on a substrate and comprising an ITO film and an FTO film, wherein a thickness of the FTO film is within a range from 5 nm to 20 nm, and the FTO film is a continuous film,
(6) the transparent conductive film according to (5), wherein a degree of change in sheet resistance following heating at 350° C. for one hour is not more than 1.5-fold, and
(7) the transparent conductive film according to (5) or (6), wherein a sheet resistance is not more than 300 Ω/sq.

The present invention also relates to:
(8) a method of producing the transparent conductive film according to any one of (5) to (7), the method comprising depositing the ITO film on a substrate using a pyrosol process, and subsequently depositing the FTO film continuously on top of the ITO film.

Effect of the Invention

In the transparent conductive film composed of an FTO/ITO laminated film according to the present invention, a part or all of the surface of the FTO film has an orthorhombic crystal structure, and therefore even if the FTO film is a thin film with a thickness of 5 nm to 20 nm, the film exhibits excellent heat resistance, and exhibits favorable result that a degree of change in the sheet resistance following heating at 350° C. for one hour is not more than 1.5-fold. Accordingly, the laminated film according to the present invention can be used as a transparent electrode plate within a liquid crystal display element or solar cell or the like, and in particular, can be also used as a transparent electrode within a dye-sensitized solar cell.

Figure 1:
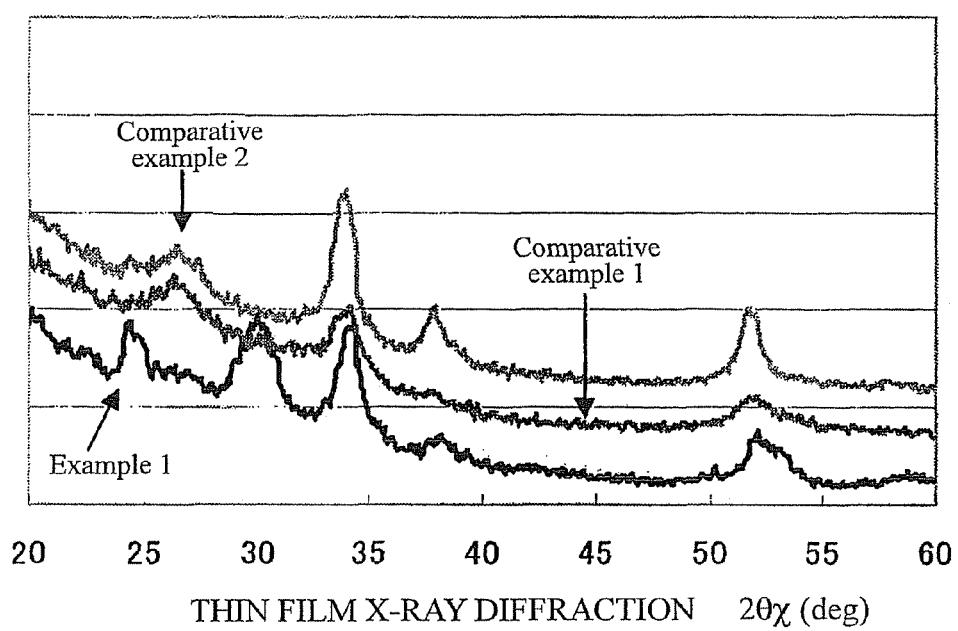
FIG. 1 is a diagram illustrating X-ray diffraction results for the surfaces of thin films prepared in an example, comparative example 1 and comparative example 2.

BEST MODE FOR CARRYING OUT THE INVENTION (Transparent Conductive Film)

A transparent conductive film of the present invention is prepared by providing an ITO film on a substrate, and then laminating an FTO film on top of the ITO film. A part or all of the surface of the FTO film has an orthorhombic crystal structure.

In the present invention, the description that a "part of the surface is an orthorhombic crystal" describes a state wherein the surface contains at least sufficient orthorhombic crystals to ensure that the above-mentioned degree of change in the sheet resistance is not more than 1.5-fold. In those cases where part of the crystal structure is orthorhombic, the remainder may be tetragonal or some other crystal system, and is typically a mixed crystal state.

Of the seven crystal systems commonly used in the field of crystallography (namely, cubic, hexagonal, rhombohedral, tetragonal, orthorhombic, monoclinic and triclinic), the orthorhombic crystal is the system in which the relationship between the axial lengths is a≠b≠c, and the relationship between the axial angles is α=β=γ=90°. Identification of the crystal system can be achieved by single crystal or powder X-ray diffraction, neutron diffraction, or electron diffraction or the like.

In order to produce an orthorhombic crystal structure, particularly in those cases where deposition is conducted using a pyrosol process, then as described below, a method must be employed in which the substrate is transported on a belt through a plurality of interconnected deposition furnaces, with the ITO film being deposited in one deposition furnace, and the FTO film then being subsequently deposited in a continuous manner in the next interconnected deposition furnace. A "continuous film" describes a film in which the crystals are aligned with no gap therebetween. If, following deposition of the ITO film within the deposition furnace, the structure temporarily exits the deposition furnace and then is introduced once again into the next deposition furnace for deposition of the FTO film, then the surface structure of the FTO film tends to be tetragonal, and the degree of change in the sheet resistance tends to exceed 1.5-fold.

Further, although there are no particular limitations on the thicknesses of the ITO film and the FTO film provided the resulting laminate can be used for a transparent electrode plate within a liquid crystal display element or solar cell or the like, in order to enable the advantages of the FTO and ITO to be realized, and in terms of the cost or the like, the thickness of the FTO film is preferably within a range from 5 nm to 20 nm, and is more preferably from 10 nm to 20 nm. On the other hand, the thickness of the ITO film is preferably within a range from 20 nm to 60 nm, and is more preferably from 30 nm to 50 nm.

The FTO film and the ITO film are each composed of at least one layer, but may also contain a plurality of layers, provided the overall film thickness does not exceed the respective range described above.

In the laminated film of an ITO film and an FTO film disclosed in Patent Document 1, the thickness of the ITO film was within a range from 100 nm to 1,000 nm, and the thickness of the FTO film was within a range from 30 nm to 350 nm. Whereas this document states that the thickness of the FTO film must be at least 30 nm in order to protect the ITO film, in the transparent conductive film of the present invention, the thicknesses of both the ITO film and the FTO film can be reduced significantly.

In the transparent conductive film of the present invention, even when the FTO film is thin with a thickness of 5 to 20 nm, the heat resistance to temperatures of 350° C. and higher is excellent, and the degree of change in the sheet resistance following heating for one hour at a temperature of 350° C. is not more than 1.5-fold, and preferably 1.2-fold or less. Further, particularly in those cases where the transparent conductive film is to be used as the transparent electrode within a dye-sensitized solar cell, a sheet resistance of not more than 300 Ω/sq is desirable, and by adjusting the film thickness, a sheet resistance of not more than 300 Ω/sq can be achieved.

(Substrate for Transparent Electrode)

The transparent conductive film of the present invention is laminated on a substrate. A transparent substrate is usually used as the substrate, although a non-transparent substrate may also be used.

Specific examples of transparent substrates include glass such as alkali glass and quartz glass, polyesters such as polycarbonate, polyethylene terephthalate and polyarylates, polyethersulfone-based resins, amorphous polyolefins, polystyrene and acrylic resins. The most appropriate of these materials may be selected in accordance with the intended application of the final product.

If required, an inorganic oxide film may be formed between the substrate and the transparent conductive film to prevent alkali components and the like from entering the transparent conductive film. Specific examples of this inorganic oxide film include films composed of silicon oxides ($SiO_x$), aluminum oxides ($Al_2O_x$), titanium oxides ($TiO_x$), zirconium oxides ($ZrO_x$), yttrium oxides ($Y_2O_x$), ytterbium oxides ($Yb_2O_x$), magnesium oxides ($MgO_x$), tantalum oxides ($Ta_2O_x$), cerium oxides ($CeO_x$) and hafnium oxides ($HfO_x$), as well as polysilane films formed from organopolysilane compounds, $MgF_2$ film, $CaF_2$ film, and composite oxide films of $SiO_x$ and $T/O_x$.

(Method of Producing Transparent Conductive Film)

The method used for producing the transparent conductive film may be any method that enables deposition of a film having the physical properties targeted by the present invention, and specific examples of methods that may be used include sputtering methods, electron beam methods, ion plating methods, screen printing methods, chemical vapor deposition methods (CVD methods), spray pyrolysis deposition methods (SPD methods) and pyrosol methods, and of these, a pyrosol method is particularly desirable.

A production method of the present invention using a pyrosol process is described in detail below.

The indium compound used in the ITO film-forming solution is preferably a compound that decomposes under heat to form indium oxide, and specific examples include indium tris(acetylacetonate) ($In(CH_3COCHCOCH_3)_3$), indium tris (benzoylmethanate) ($In(C_6H_5COCHCOC_6H_5)_3$), indium trichloride ($InCl_3$), indium nitrate ($In(NO_3)_3$) and indium tri-isopropoxide ($In(OPr-i)_3$).

Further, the tin compound is preferably a compound that decomposes under heat to form stannic oxide, and specific examples include stannic chloride, dimethyltin dichloride, dibutyltin dichloride, tetrabutyltin, stannous octoate ($Sn(OCOC_7H_{15})_2$), dibutyltin maleate, dibutyltin acetate and dibutyltin bis(acetylacetonate).

Moreover, in addition to the above-mentioned indium compound and tin compound, the ITO film may be also formed by adding a third component, examples of which include group 2 elements from the periodic table such as Mg, Ca, Sr and Ba, group 3 elements such as Sc and Y, lanthanoids such as La, Ce, Nd, Sm and Gd, group 4 elements such as Ti, Zr and Hf, group 5 elements such as V, Nb and Ta, group 6 elements such as Cr, Mo and W, group 7 elements such as Mn, group 9 elements such as Co, group 10 elements such as Ni, Pd and Pt, group 11 elements such as Cu and Ag, group 12 elements such as Zn and Cd, group 13 elements such as B, Al and Ga, group 14 elements such as Si, Ge and Pb, group 15 elements such as P, As and Sb, and group 16 elements such as Se and Te, which may be added as stand-alone elements or as compounds thereof.

Examples of the fluorine compound used in the FTO film-forming solution include hydrogen fluoride, sodium fluoride, trifluoroacetic acid, difluoroethane and bromotrifluoromethane. Further, as the tin compound, the above-mentioned tin compounds used in the production of the ITO film may be used.

The above compounds are dissolved in an organic solvent, examples of which include alcohols such as methanol and ethanol, and ketones such as acetone, methyl butyl ketone and acetylacetone, thus preparing an FTO film-forming solution and an FTO film-forming solution.

Deposition of the ITO film and the FTO film onto the transparent substrate using a pyrosol process is conducted in the manner described below.

A plurality of conveyor-based deposition furnaces that have been preheated to a temperature of 400 to 750° C., and preferably 400 to 550° C., are connected together, and the substrate is introduced into the furnace. The ITO film-forming solution is sprayed into the first deposition furnace and the FTO film-forming solution is sprayed into the second deposition furnace, in each case using ultrasound to form a mist of the solution and using air as a carrier gas. Upon contacting the surface of the substrate, the solution mist undergoes thermal decomposition, forming a film. The film thickness can be adjusted by altering the speed of the conveyor.

By interconnecting three or more deposition furnaces, at least one of the ITO film and the FTO film can be formed as a multilayer film. Further, an additional inorganic oxide film such as a $SiO_2$ film or the like may be deposited in the first deposition furnace if required.

EXAMPLES

Examples are described below, although the technical scope of the present invention is in no way limited by the following examples.

Example 1

Glass/$SiO_2$/ITO/FTO Laminate (Continuous Deposition)

Three conveyor furnaces (furnace (1) to (3)) that had been heated to 500° C. were interconnected, and a soda lime glass substrate (320×420×0.7 mm) was introduced through the conveyor furnaces. Using an $SiO_2$ film-forming solution (tetraethoxysilane (solution I)) in the first furnace, an ITO film-forming solution (an acetylacetone solution including 0.2 mol/L of indium acetylacetone containing 5 mol % of stannic chloride (solution II)) in the second furnace, and an FTO film-forming solution (an ethanol solution including 0.5 mol/L of dibutyltin diacetate containing 150 mol % of fluorine (solution (III)) in the third furnace, each solution was converted to a mist using ultrasound, and then sprayed into the respective conveyor furnace using air as a carrier gas. Upon contact with the surface of the glass substrate, each solution underwent thermal decomposition, resulting in the continuous formation of a laminate. The resulting laminate was glass/$SiO_2$ film (40 nm)/ITO film (40 nm)/FTO film (13 nm).

Comparative Example 1

Glass/$SiO_2$/ITO/FTO Laminate (Non-Continuous Deposition)

For the purposes of comparison, a laminate with substantially the same film thickness as the example was produced by depositing an ITO film having the same composition as that of the example on a glass substrate, temporarily removing the glass substrate from the furnace, and then once again introducing the glass substrate into a deposition furnace to deposit an FTO film on top of the ITO film.

In the first deposition, with the exceptions of interconnecting only two conveyor furnaces (furnace (1) and (2)) that had been heated to 500° C., introducing a soda lime glass substrate (320×420×0.7 mm) through the conveyor furnaces, and using an $SiO_2$ film-forming solution (tetraethoxysilane (solution I)) in the first furnace, and an ITO film-forming solution (an acetylacetone solution including 0.2 mol/L of indium acetylacetone containing 5 mol % of stannic chloride (solution II)) in the second furnace, a laminate was produced in the same manner as example 1. The resulting laminate was glass/$SiO_2$ film (40 nm)/ITO film (40 nm).

In the second deposition, with the exceptions of using a single conveyor furnace heated to 500° C., introducing the glass/$SiO_2$/ITO laminate obtained in the first deposition into the conveyor furnace, and using an FTO film-forming solution (an ethanol solution including 0.5 mol/L of dibutyltin diacetate containing 150 mol % of fluorine (solution (III)), a laminate was produced in the same manner as that described for example 1. The resulting laminate was glass/$SiO_2$ film (40 nm)/ITO film (40 nm)/FTO film (17 nm).

Comparative Example 2

Glass/SiO$_2$/ITO/FTO Laminate

A first deposition was performed in the same manner as comparative example 1 to produce a laminate. The resulting laminate was glass/SiO$_2$ film (40 nm)/ITO film (40 nm).

With the exception of employing a slower conveyor transport rate than that used in comparative example 1, a second deposition was then performed in the same manner as comparative example 1, producing a laminate. The resulting laminate was glass/SiO$_2$ film (40 nm)/ITO film (40 nm)/FTO film (54 nm).

The laminates from example 1, comparative example 1 and comparative example 2 were each evaluated for film thickness, sheet resistance before and after heating at 350° C. for one hour, the degree of change in the heat resistance, visible light transmittance, the crystal system of the FTO film, and cross-sectional structure. The results are shown in Table 1 and FIG. 1.

The film thickness were measured using an ellipsometer (SE800, manufactured by Aimec Corporation), sheet resistance were measured using the four-terminal method, the visible light transmittance (550 nm) was measured using a spectrophotometer (U4000, manufactured by Hitachi, Ltd.), the crystal systems were determined using a horizontal X-ray diffraction apparatus for thin-film samples (SmartLab, manufactured by Rigaku Corporation), and the cross-sectional structures were evaluated using a cross-sectional TEM method.

The results revealed that compared with the conventional laminates, the laminate of the present invention exhibited improved heat resistance, despite having a thinner FTO film thickness (see Table 1).

Figure 2:
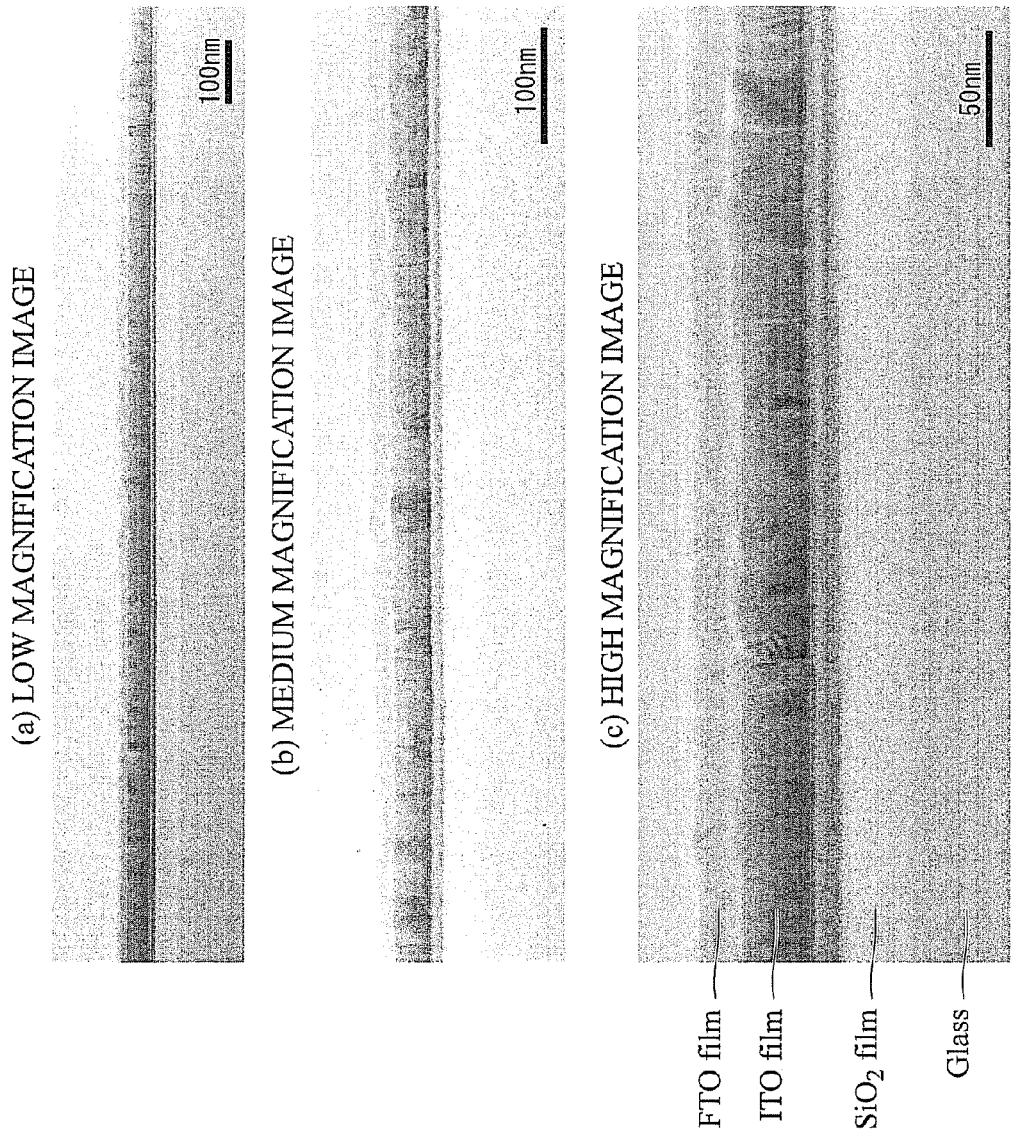
FIG. 2 is a diagram illustrating the results of cross-sectional structure observation of a laminate of an example using a cross-sectional TEM method.
Figure 3:
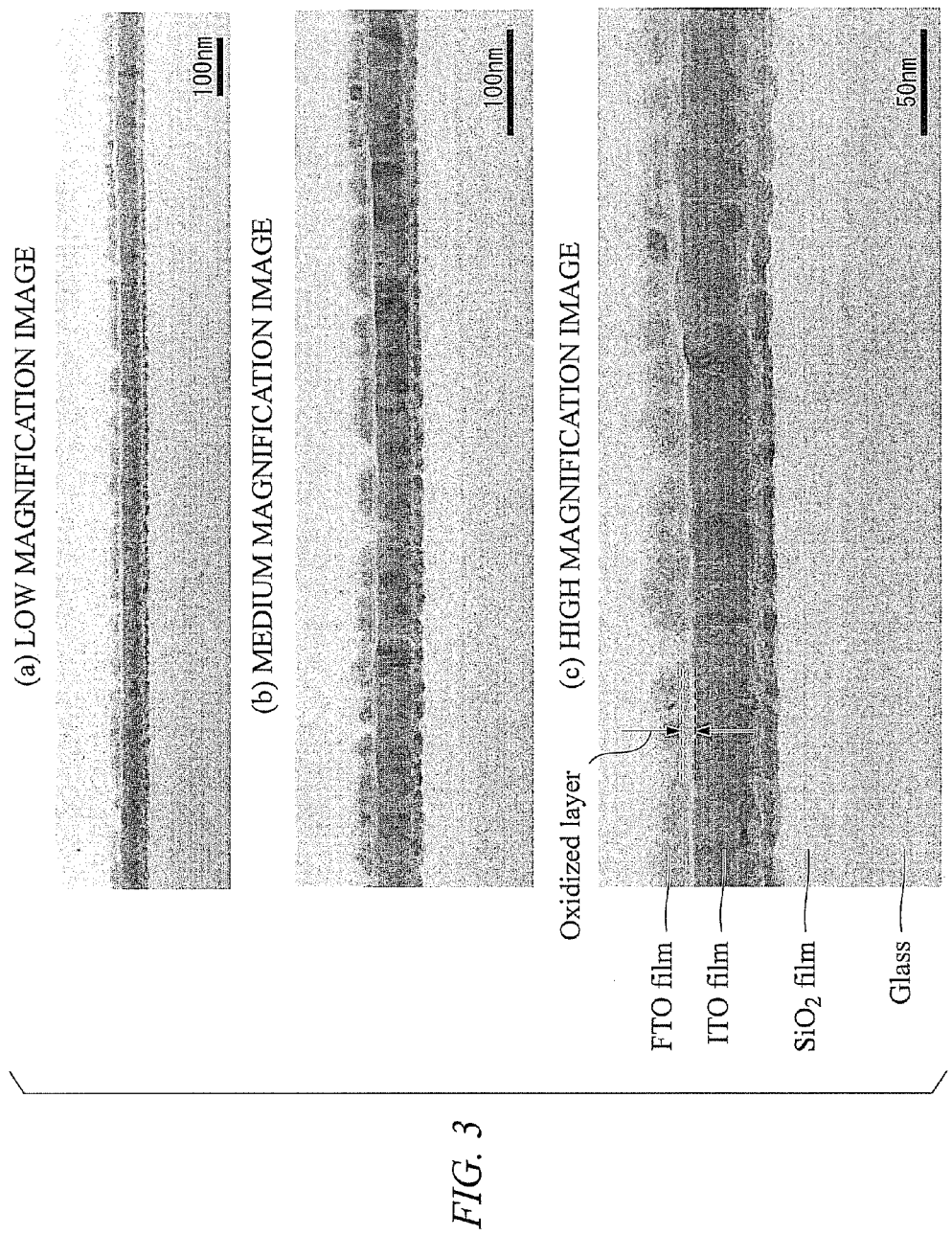
FIG. 3 is a diagram illustrating the results of cross-sectional structure observation of a laminate of comparative example 1 using a cross-sectional TEM method.

Further, it was also discovered that the crystal system of the FTO film in the laminate of the present invention was orthorhombic, which was different from the crystal system (tetragonal) of the FTO films of the conventional laminates (see FIG. 1). Moreover, although the surface of the FTO film in the laminate of the present invention displayed very fine asperity, the surface smoothness was still favorable (see FIG. 2), whereas the surface of the FTO film in the conventional laminate had significant surface asperity and suffered from poor surface smoothness (see FIG. 3).

TABLE 1

| | Deposition number | SiO$_2$ film thickness (nm) | ITO film thickness (nm) | FTO film thickness (nm) | Solution used within each furnace (1) | (2) | (3) | Sheet resistance (Ω/sq) | Sheet resistance after heating (Ω/sq) | Degree of change (times) | Visible light transmittance (%) | FTO film crystal system |
|---|---|---|---|---|---|---|---|---|---|---|---|---|
| Example 1 | one time | 40 | 40 | 13 | solution (I) | solution (II) | solution (III) | 96 | 116 | 1.20 | 80.3 | orthorhombic |
| Comparative example 1 | first | 40 | 40 | — | solution (I) | solution (II) | — | 143 | 293 | 2.05 | 80.0 | tetragonal |
| | second | — | — | 17 | solution (III) | — | — | | | | | |
| Comparative example 2 | first | 40 | 40 | — | solution (I) | solution (II) | — | 110 | 139 | 1.26 | 78.1 | tetragonal |
| | second | — | — | 54 | solution (III) | — | — | | | | | |

The invention claimed is:

1. A transparent conductive film for lamination on a substrate and comprising an ITO film and an FTO film, wherein a part or all of a crystal structure of a surface of the FTO film is orthorhombic.

2. The transparent conductive film according to claim 1, wherein a degree of change in sheet resistance following heating at 350° C. for one hour is not more than 1.5-fold.

3. The transparent conductive film according to claim 1 or 2, wherein a sheet resistance is not more than 300 Ω/sq.

4. A method of producing the transparent conductive film comprising: an ITO film and an FTO film, wherein a part or all of a crystal structure of a surface of the FTO film is orthorhombic, the method comprising depositing the ITO film on a substrate using a pyrosol process, and subsequently depositing the FTO film continuously on top of the ITO film.

* * * * *